United States Patent
Ziari et al.

(10) Patent No.: US 6,215,809 B1
(45) Date of Patent: Apr. 10, 2001

(54) STABILIZATION OF LASER SOURCES WITH CLOSELY-COUPLED OPTICAL REFLECTORS USING AN INTERNAL DITHER CIRCUIT

(75) Inventors: Mehrdad Ziari, Pleasanton; Robert G. Waarts, Fremont; Robert J. Lang, Pleasanton, all of CA (US); John DeAndrea, Lawrenceville, NJ (US); Michael L. Bortz, Columbia, MO (US); Brian F. Ventrudo, Ottawa (CA)

(73) Assignee: SDL, Inc., San Jose, CA (US)

( * ) Notice: Subject to any disclaimer, the term of this patent is extended or adjusted under 35 U.S.C. 154(b) by 0 days.

(21) Appl. No.: 09/197,062

(22) Filed: Nov. 20, 1998

Related U.S. Application Data

(63) Continuation-in-part of application No. 08/621,555, filed on Mar. 25, 1996.

(51) Int. Cl.$^7$ .................................................... H01S 3/08

(52) U.S. Cl. .............................. 372/96; 372/6; 372/32; 372/92; 372/91; 372/22; 372/64; 372/102; 372/38; 372/20; 372/50; 372/108; 372/26; 359/326; 359/330; 359/341; 356/460; 356/464

(58) Field of Search .................................. 372/96, 6, 92, 372/91, 22, 64, 102, 38, 20, 50, 108, 26, 32; 359/326, 330, 341; 356/460, 464

(56) References Cited

U.S. PATENT DOCUMENTS

| | | | |
|---|---|---|---|
| 4,802,178 | * | 1/1989 | Ury ........................................ 372/36 |
| 5,065,401 | | 11/1991 | Scifres et al. . |
| 5,333,142 | * | 7/1994 | Scheps ................................... 372/22 |
| 5,373,384 | * | 12/1994 | Hebert ................................. 359/161 |

(List continued on next page.)

OTHER PUBLICATIONS

"Fibre Bragg Reflector for Mode Selection and Line-Narrowing of Injection Lasers," by Brinkmeyer, et al., *Electronic Letters*, Jan. 30, 1986, vol. 22, No. 33, pp. 134–135.

*Primary Examiner*—Frank G. Font
*Assistant Examiner*—Delma R. Flores Ruiz
(74) *Attorney, Agent, or Firm*—Gallagher & Lathrop; David N. Lathrop

(57) ABSTRACT

Apparatus for providing a laser source optically coupled to an optical waveguide, such as an optical fiber, having a reflective grating positioned from the output facet of the laser source a distance equal to or greater than the coherence length of the laser source providing a portion of reflective feedback into the laser source optical cavity to maintain wavelength operation of the laser source in spite of changes in the laser operating temperature or drive current based upon coherence collapse in the laser operation. In cases where the fiber grating is positioned in the fiber within the coherence length of the laser source, intermittent coherence collapse, as opposed to continuous coherence collapse, is unavoidable. In cases where such a laser source is a pumping source for a solid state gain medium, such as an optical amplifier or laser having an active gain element, e.g., an Er doped amplifier, undesirable perturbations in the laser source output are present which have a deleterious effect on the operation of the solid state gain medium. The effect of these undesirable perturbations are substantially removed by a small, continuous variation or dither in the driving current of the laser source having a rate of variation that exceeds the active gain element excited state lifetime thereby controlling the switching of the laser source operation between states of coherency and coherence collapse. As a result, the effects of laser source perturbations are avoided so as not to have an effect on the operation of the coupled solid state gain medium so that its gain stability is improved. Various embodiments of dither circuits are disclosed. In addition, polarization-maintaining behavior is induced in optical waveguides to further improve laser source stability.

59 Claims, 10 Drawing Sheets

U.S. PATENT DOCUMENTS

| | | | |
|---|---|---|---|
| 5,457,568 | * 10/1995 | Jacobovitz-Veselka et al. | 359/341 |
| 5,477,368 | 12/1995 | Eskildsen et al. . | |
| 5,485,481 | 1/1996 | Ventrudo . | |
| 5,499,135 | 3/1996 | Heidemann . | |
| 5,563,732 | 10/1996 | Erdogan . | |
| 5,703,893 | * 12/1997 | Komiyama et al. | 372/43 |
| 5,715,263 | * 2/1998 | Ventrudo et al. | 372/6 |
| 5,724,377 | 3/1998 | Huang . | |
| 5,912,910 | * 6/1999 | Sanders et al. | 372/22 |
| 5,930,430 | 5/1999 | Pan et al. . | |
| 6,044,093 | * 3/2000 | Ventrudo et al. | 372/6 |
| 6,058,128 | * 5/2000 | Ventrudo | 372/96 |

* cited by examiner

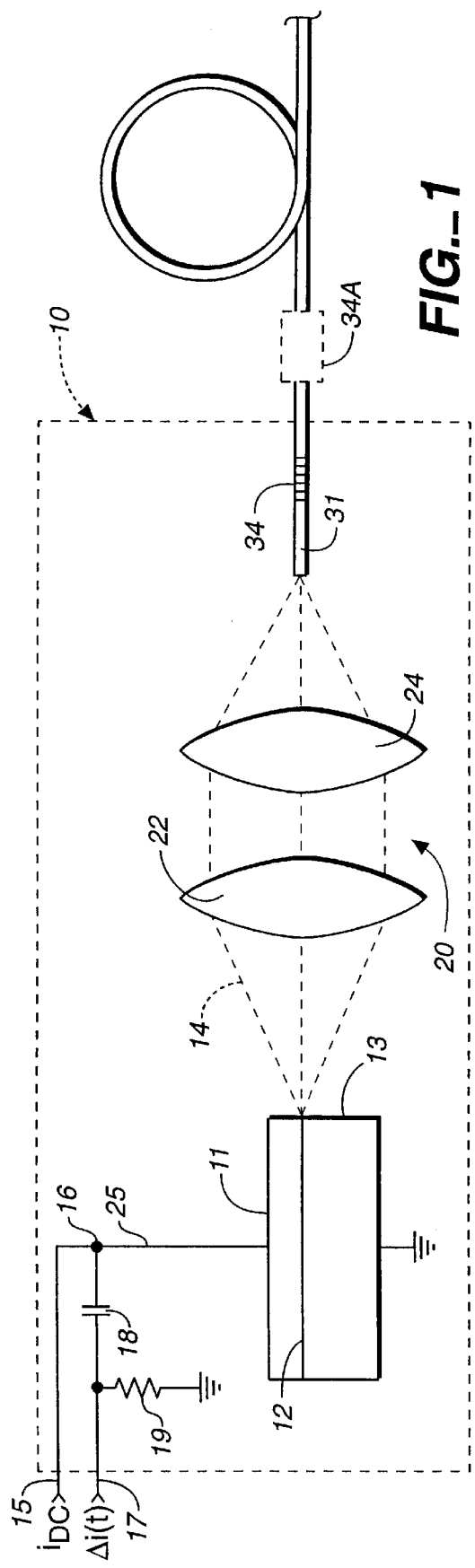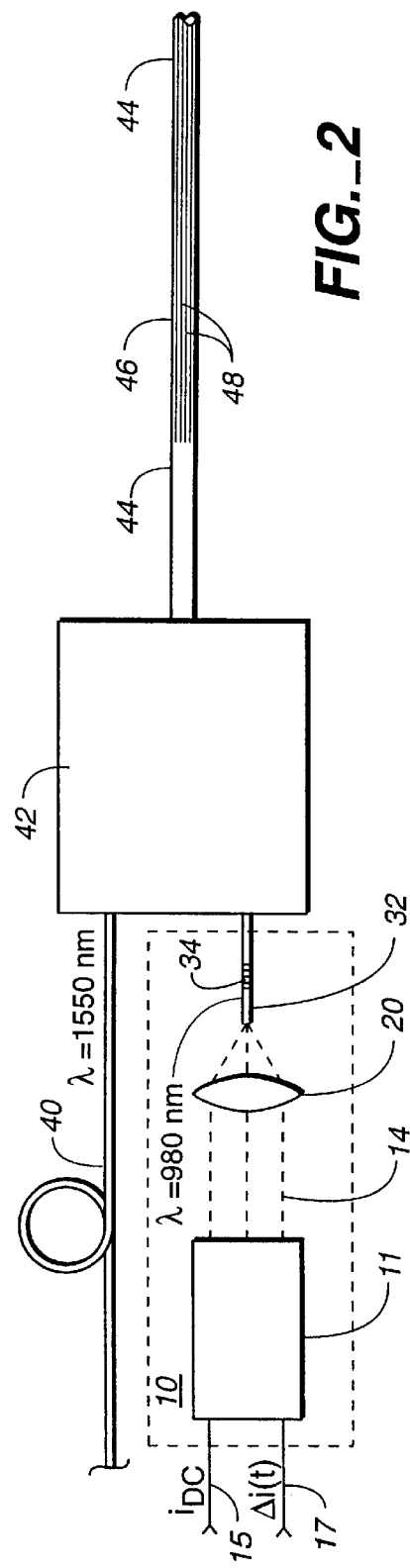

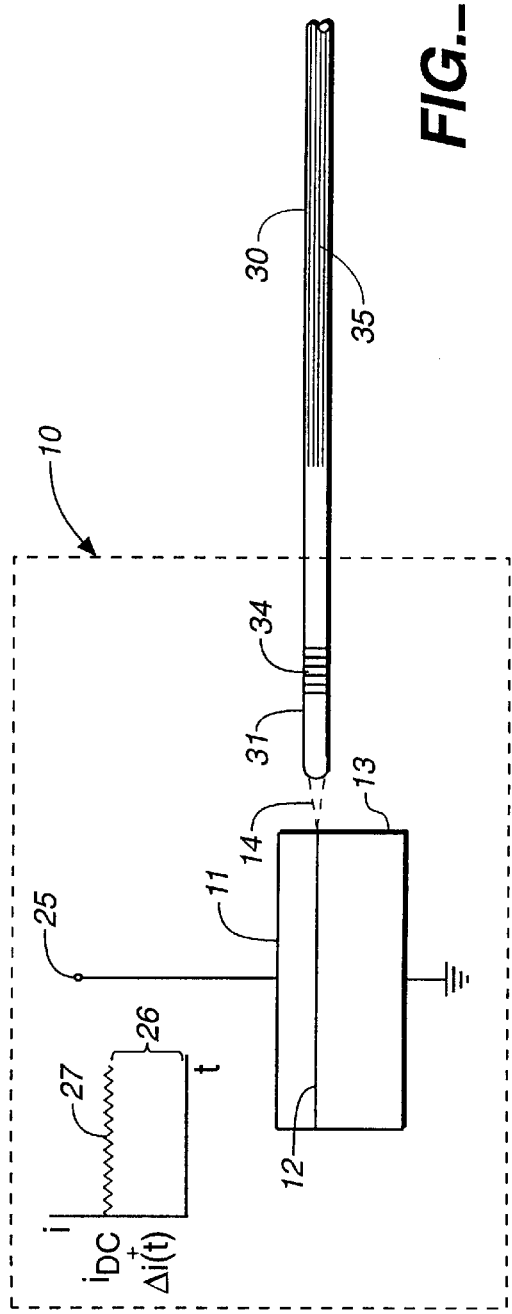
FIG._3
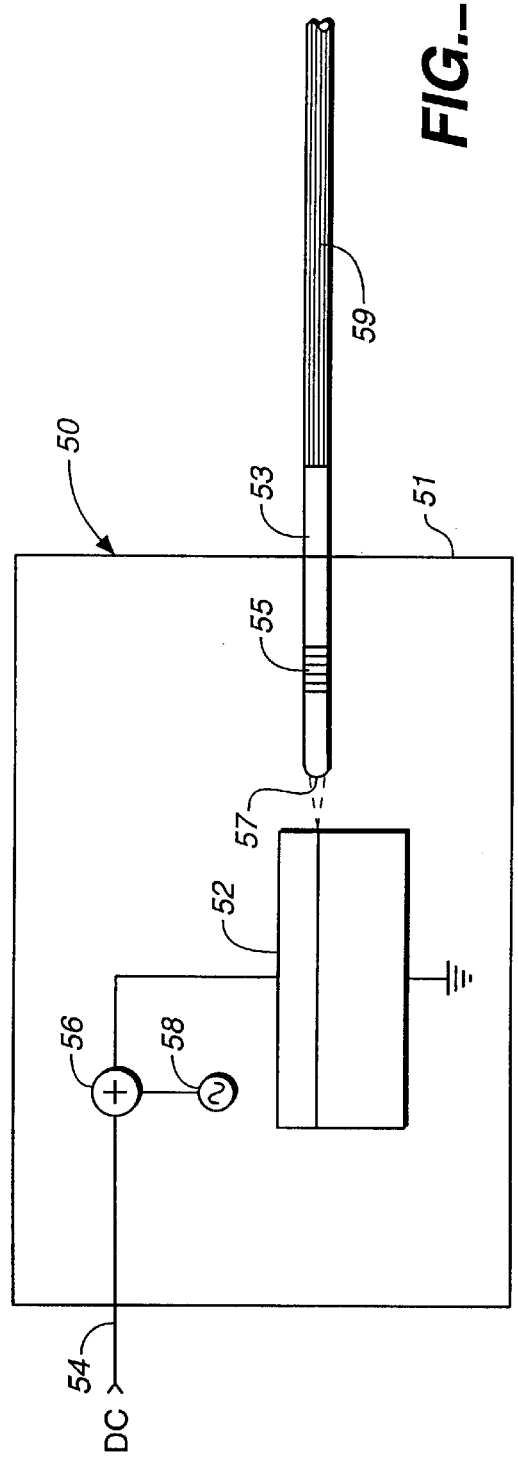
FIG._6

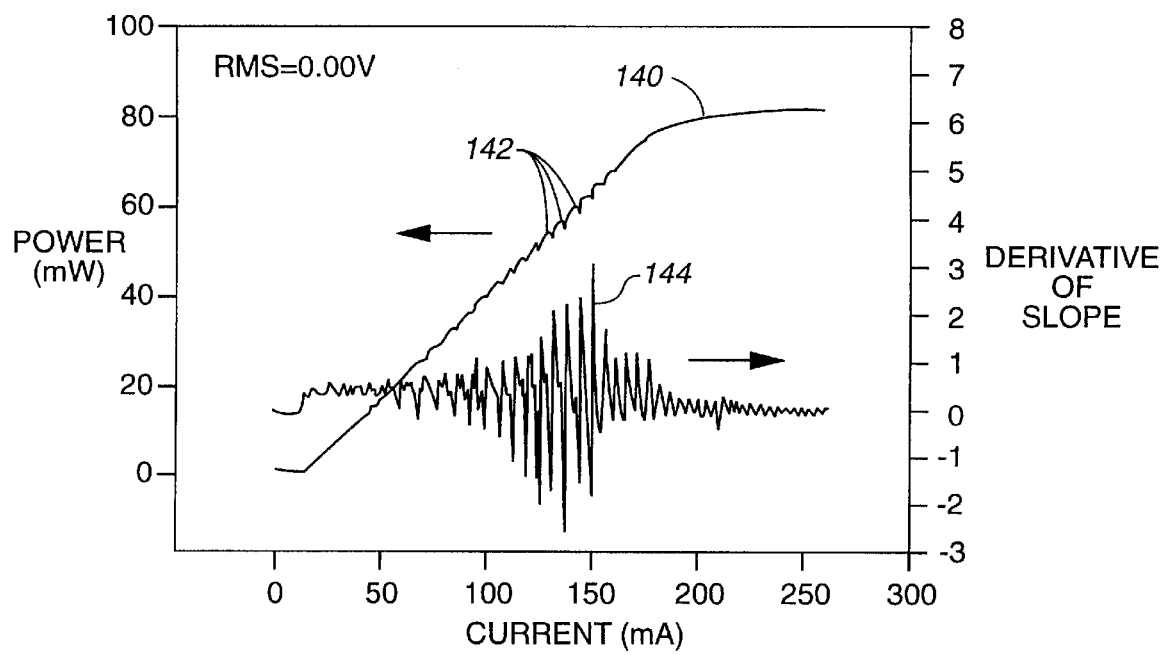
FIG._4
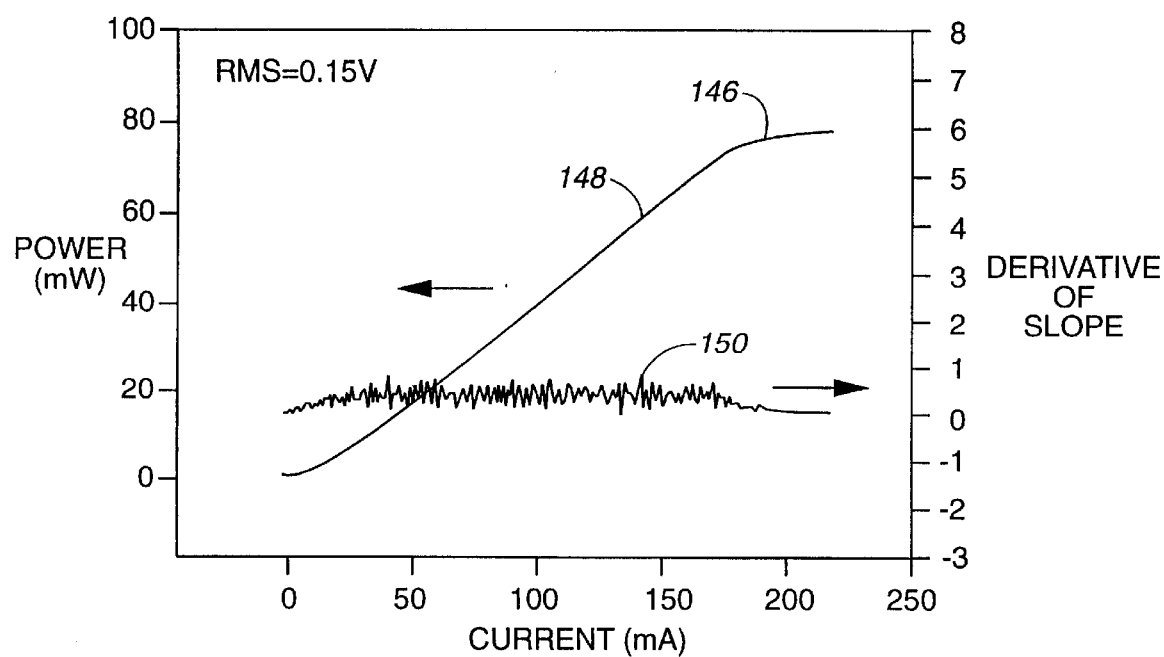
FIG._5

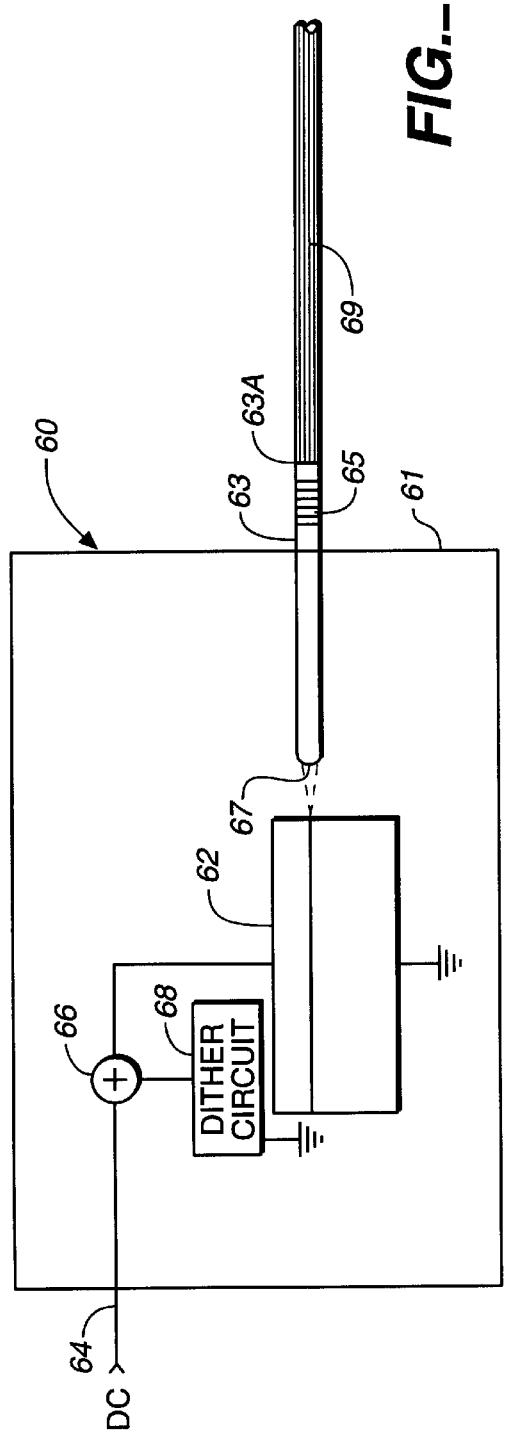
FIG._7
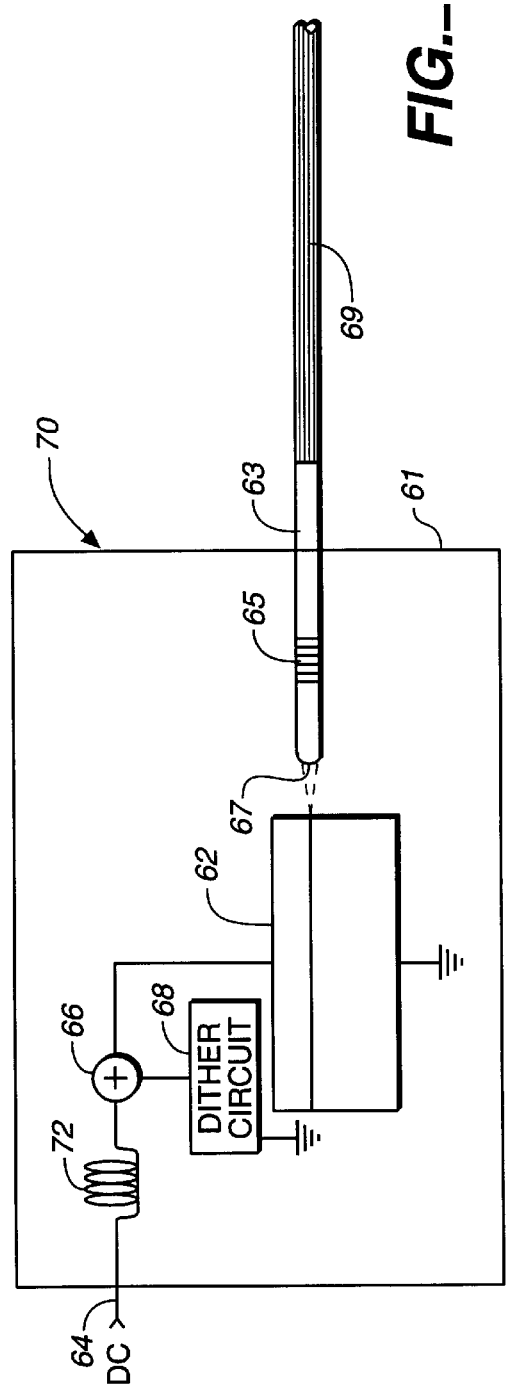
FIG._8

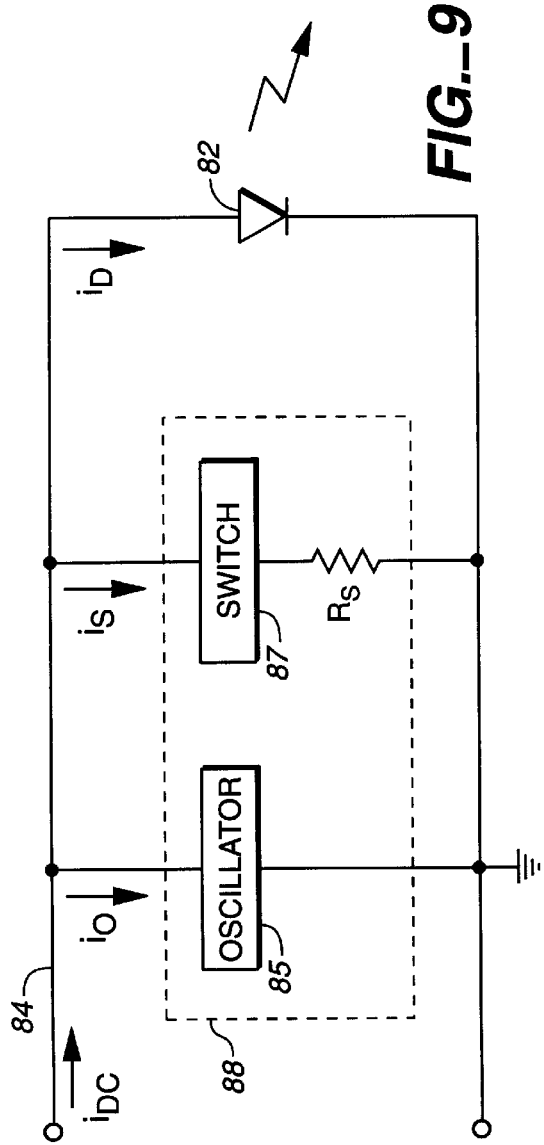
FIG._9
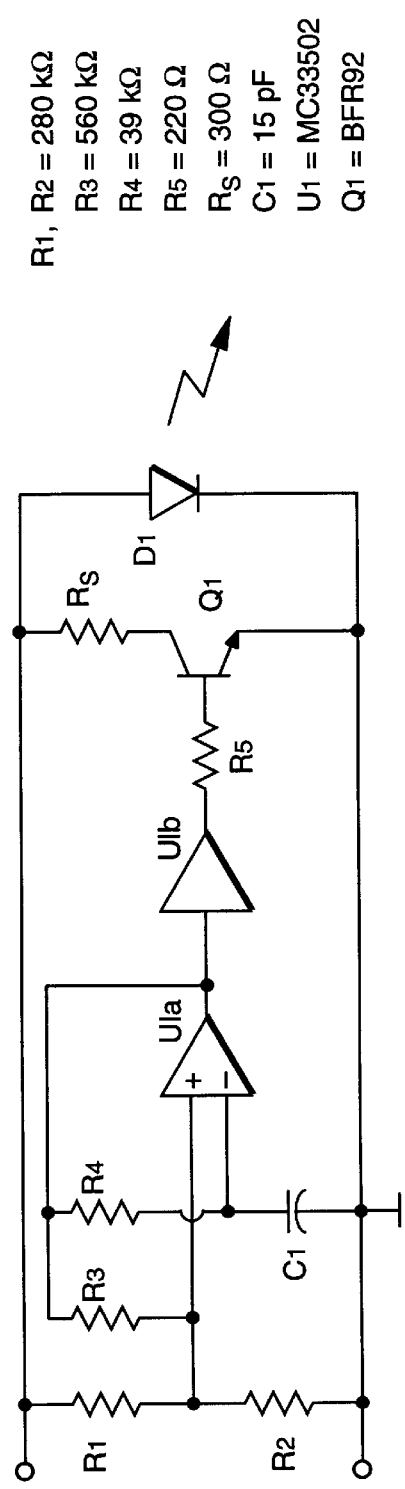
R1, R2 = 280 kΩ
R3 = 560 kΩ
R4 = 39 kΩ
R5 = 220 Ω
Rs = 300 Ω
C1 = 15 pF
U1 = MC33502
Q1 = BFR92
FIG._10

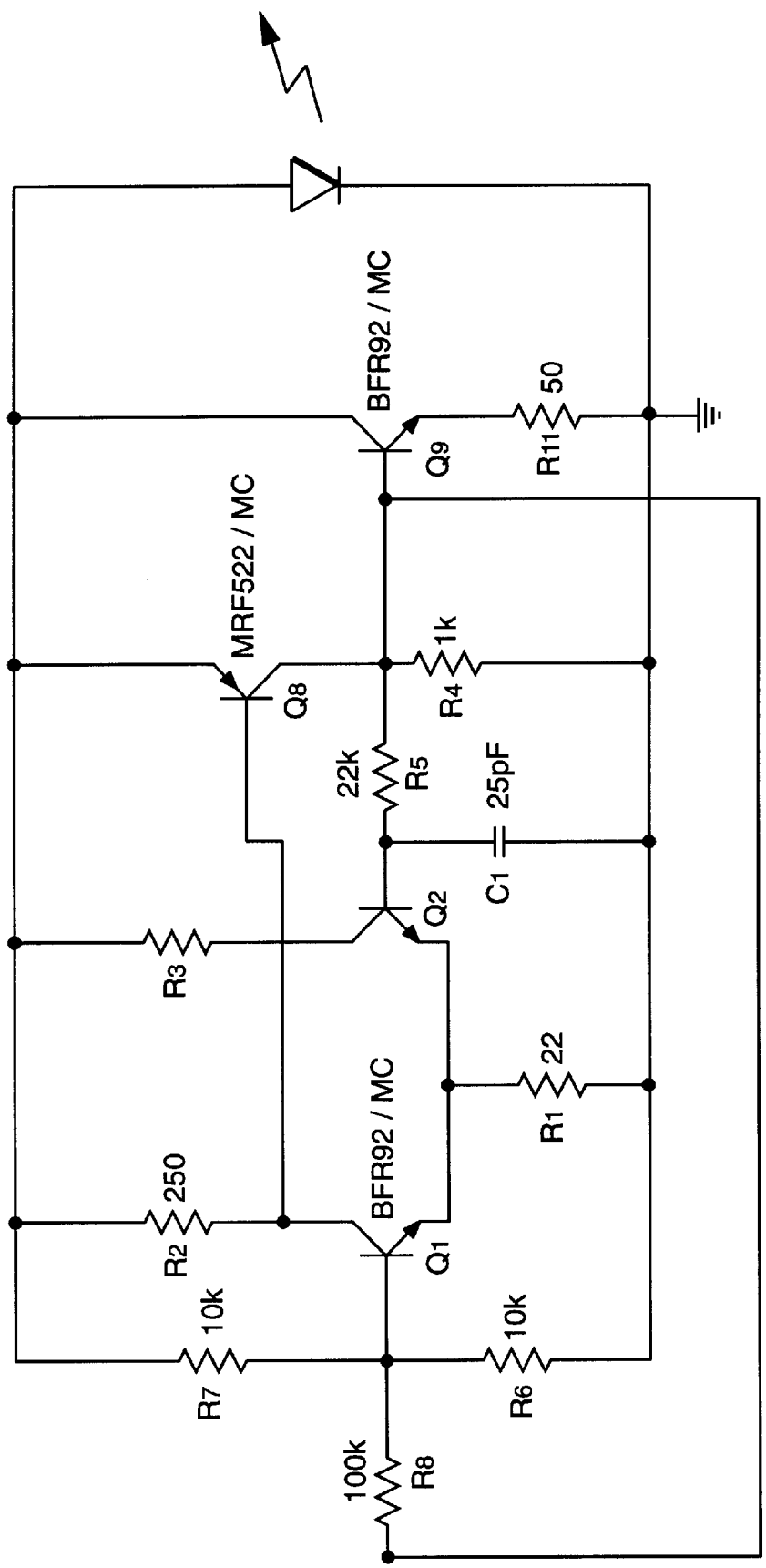
FIG._11

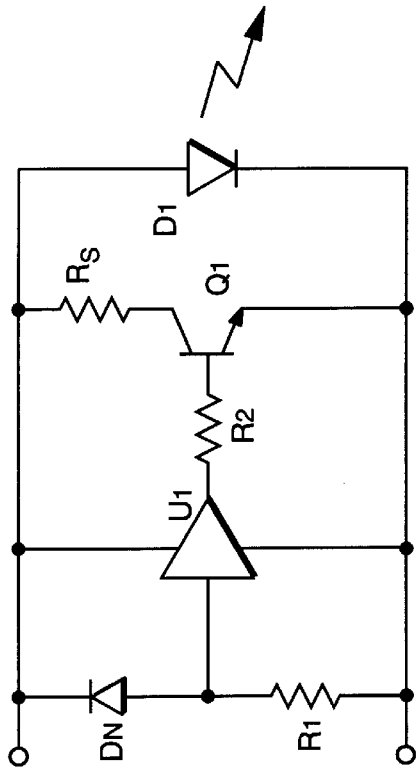
FIG._14
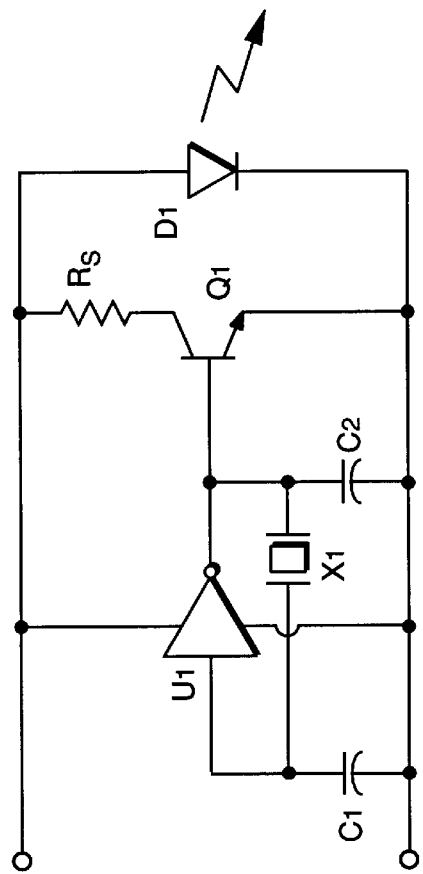
FIG._12
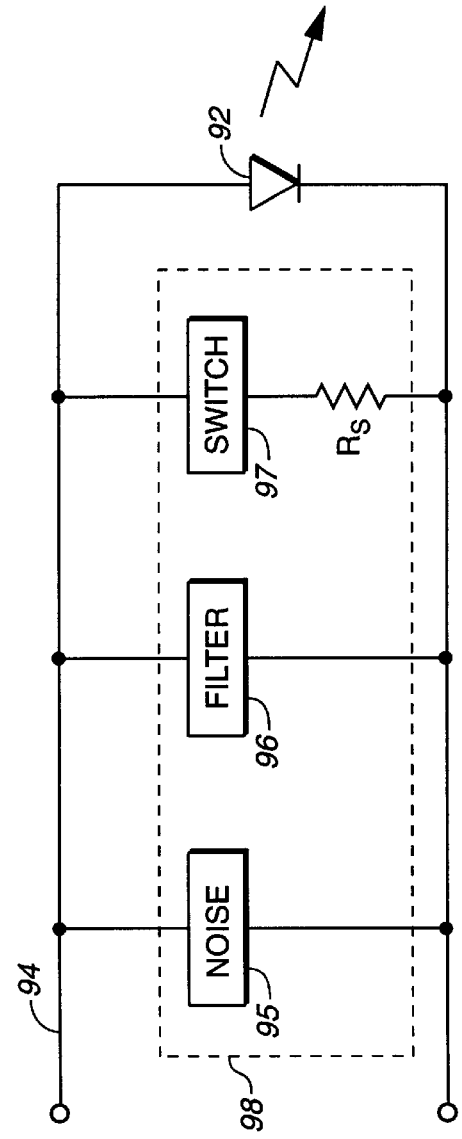
FIG._13

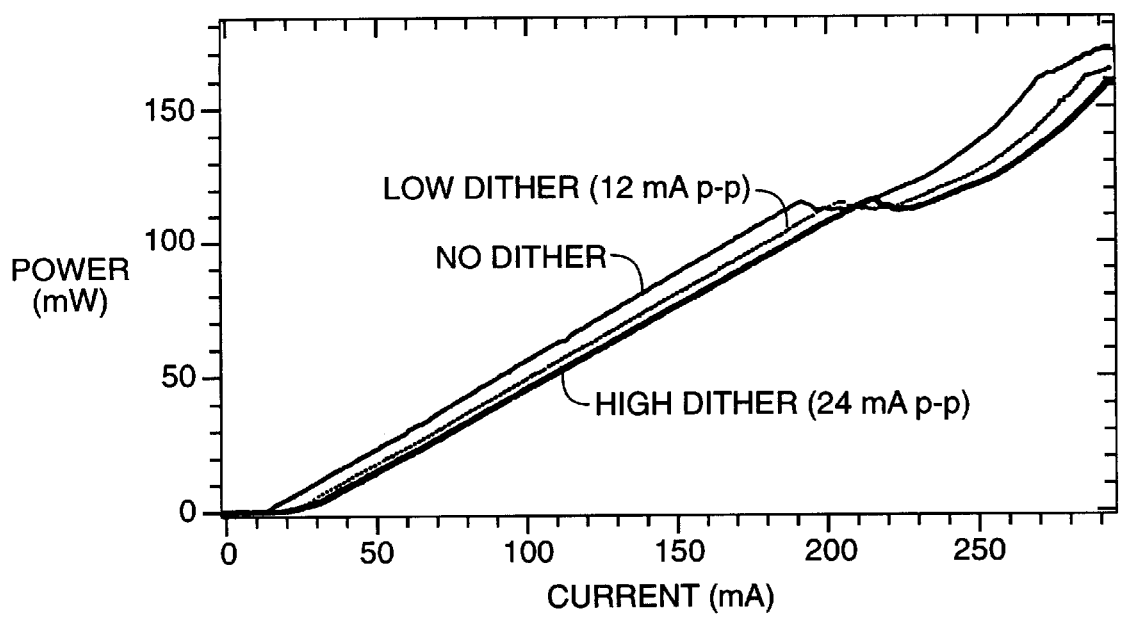
FIG._15
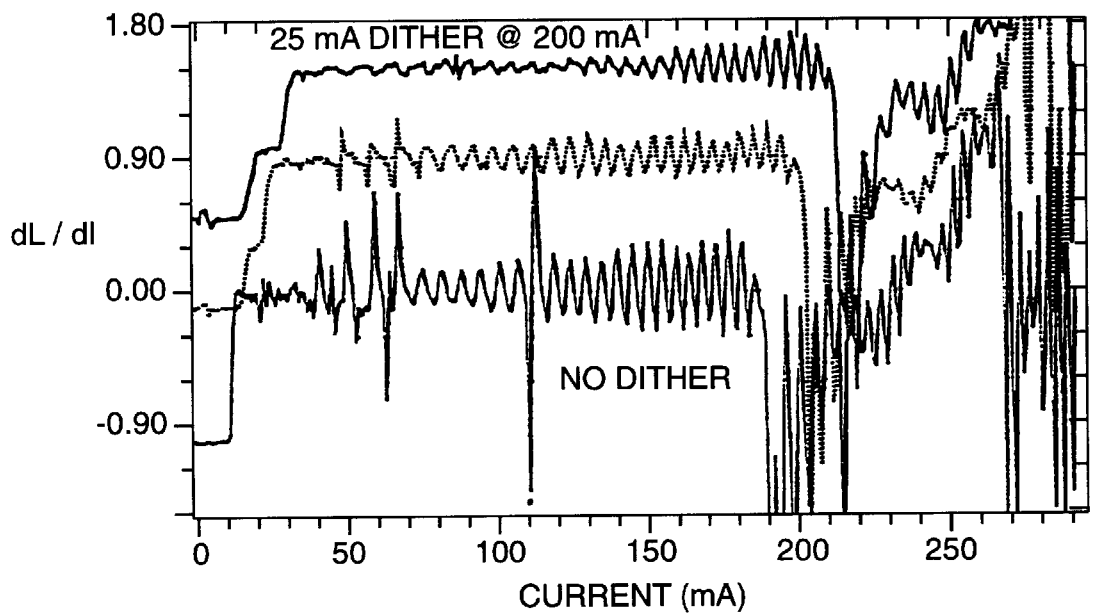
FIG._16

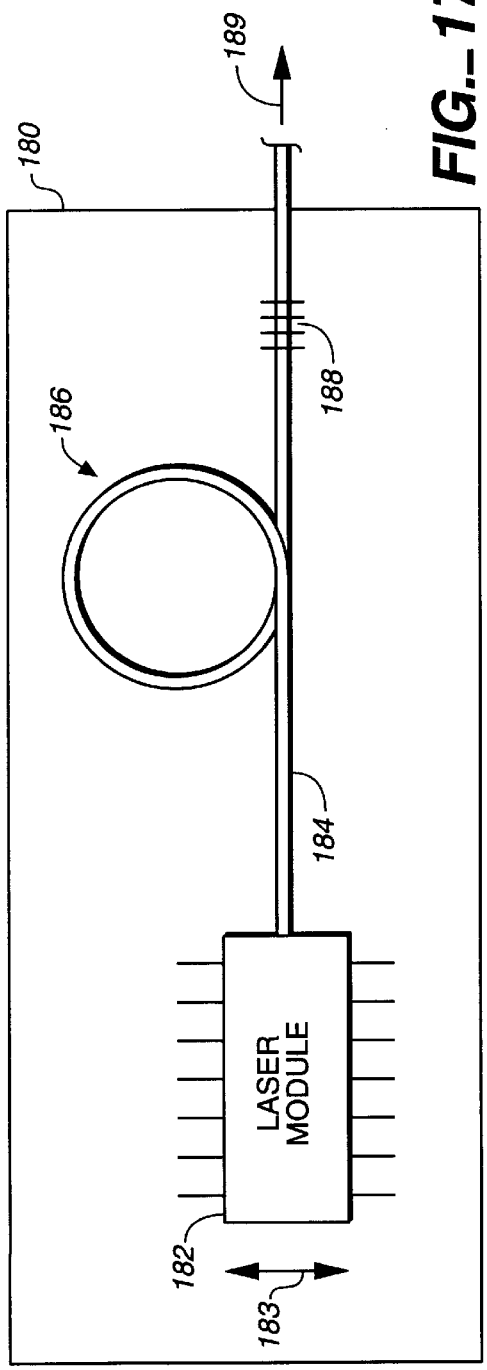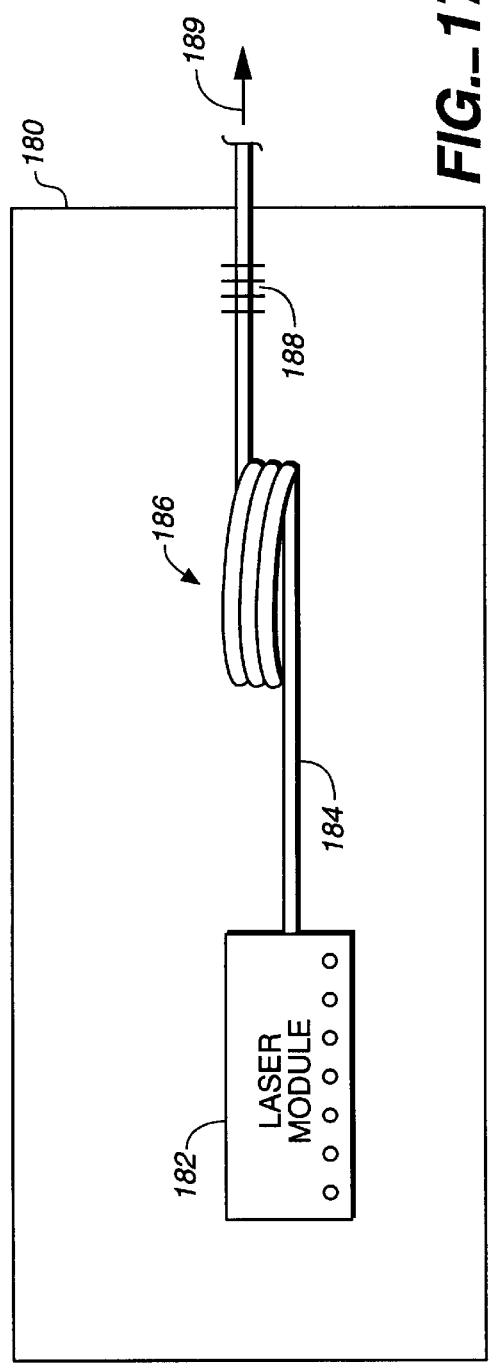

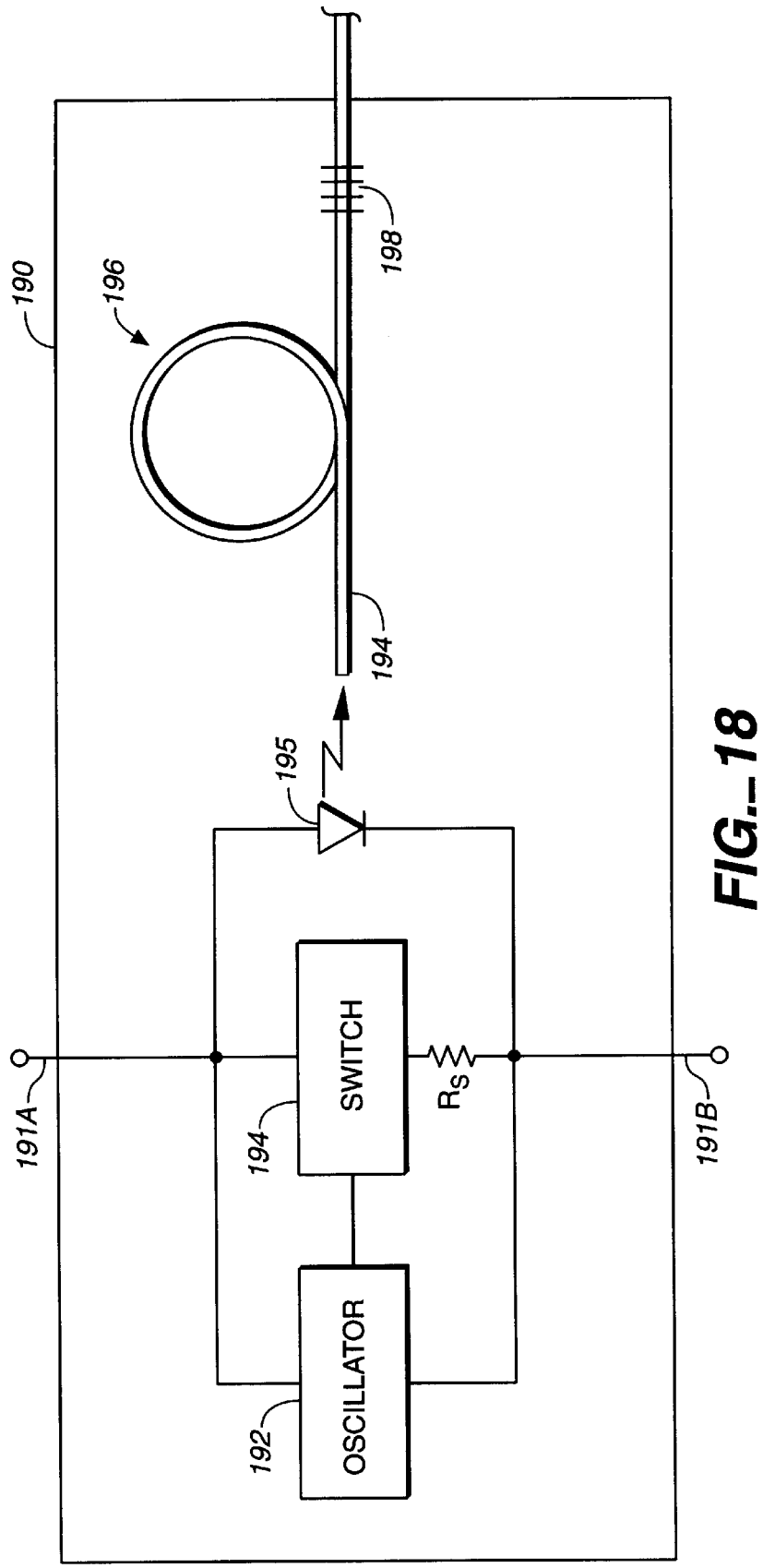
FIG._18

STABILIZATION OF LASER SOURCES WITH CLOSELY-COUPLED OPTICAL REFLECTORS USING AN INTERNAL DITHER CIRCUIT

CROSS-REFERENCE TO RELATED APPLICATION

This application is a continuation-in-part of copending U.S. pat. application Ser. No. 08/621,555, filed Mar. 25, 1996, owned by the assignee of this application and incorporated herein by reference in its entirety.

FIELD OF THE INVENTION

This invention relates generally to optical gain media coupled with optical gratings to provide for wavelength control of a laser source and, more particularly, relates to an apparatus for stabilization of laser sources with an optically coupled waveguide grating in close proximity to the laser source, which may be used as an optical power source for an optical solid state or fiber amplifier or laser.

BACKGROUND OF THE INVENTION

In U.S. Pat. Nos. 5,485,481 and 5,715,263, which are assigned to the assignee of this patent application and are incorporated herein by reference in their entirety, there is disclosed the utilization of a fiber grating coupled to a gain medium comprising a semiconductor laser source to control, stabilize and maintain stabilization of the operation of the laser within a given wavelength band. The fiber coupled laser is sometimes referred to as pigtailed laser. The assembly of the laser source together with the coupling optics and optic fiber pigtail are provided in a customer-convenient pin-out "package" or industry-standard enclosure that is sealed to hide the components inside the enclosure as well as to improve handling and environmental ruggedness. A few examples of industry-standard enclosures are those known in the industry as "P5", "P6", 14-pin butterfly packages, various coaxial packages such as a TO container and a variety of newer designs including so called MINI-DIL, MINI-SMD and MINI-PIN packages.

In employing a semiconductor laser source having a comparatively wide gain bandwidth, the laser source will tend to have multiple longitudinal modes. Due to changes in various operating conditions, such as changes in ambient temperature or operating current, the laser operation may readily jump from one longitudinal mode to another. Changes in light output intensity caused by the mode jumps are sufficient in magnitude to affect the performance of a fiber amplifier being pumped by such a source because these changes cause a corresponding jump in the reciprocal lifetime of the excited energy level of the amplifier active element, which is usually a rare earth material. This in turn causes noticeable jumps or modulation in the amplified light signal in the amplifier. These modulations cannot be tolerated in optical fiber telecommunication systems.

The foregoing mentioned patents address this problem by placing a fiber grating in the output of the laser source, spaced from the laser source, having a bandwidth sufficiently wide to cause the laser source to operate in the "coherence collapse" regime. In essence, the fiber grating is positioned a sufficient distance from the laser source and the small amount of light reflected back into the laser source can be characterized as a weak source of "noise" to the laser source. The operation of the laser source locks onto this noise-like feedback and maintains its operation within the wavelength bandwidth of the fiber grating. In this coherence collapse regime, the laser source is not allowed to lock onto any one wavelength or longitudinal mode but instead is induced to jump from one longitudinal mode to another. The bandwidth and spacing of the reflective grating is controlled to cause the laser source to jump between modes at a rate that is higher than the reciprocal lifetime of the amplifier active element. In a sense, the amplifier gain element acts as a low-pass filter to smooth the changes in light intensity caused by jumps between longitudinal modes of operation. As a result, mode transitions have little or no effect on the operation of the fiber amplifier.

The length of the pigtail fiber between the laser source output facet and the fiber rating represents an external cavity in addition to the laser source cavity. While coherence is maintained in the laser source cavity, no coherence is established in the external cavity because of its comparatively long length and the wide bandwidth of the grating. To provide reasonable assurance of stabilization in the coherence collapse regime, the length of the pigtail fiber between grating and laser output facet should be greater than the coherence length of the laser source. Also, it is generally preferred that the reflectivity level of the laser source output facet be higher than the reflectivity level of the grating; however, this is not an absolute requirement, depending upon the fiber grating bandwidth and the distance of the fiber grating from the laser source output facet.

The use of a reflector grating in this manner helps bring about coherence collapse because the optical feedback from the fiber grating acts as a perturbation of the coherent optical field formed in the laser source cavity. This perturbation acts to break the coherence of the laser operating mode, which is referred to as coherence collapse, and broadens the bandwidth of the laser emission by several orders of magnitude, resulting in multiple longitudinal mode operation of the laser source. The fiber grating effectively locks the laser source cavity output to the fixed wavelength of the fiber grating and centers the external cavity multi-longitudinal modes around that wavelength. The presence of the multi-longitudinal modes significantly reduces the magnitude of mode-transition noise in the laser so that no single longitudinal mode produced by the laser source contains, for example, more than about 20% of the total optical power produced by the laser source. In addition, the center wavelength of emission remains near the wavelength of maximum reflection from the fiber grating. The laser source is, thus, constrained to operate within the grating bandwidth so that large fluctuations in wavelength of the laser source, such as caused by changes in temperature or operating current, are eliminated. Additionally, the laser source is not perturbed by extraneous optical feedback from reflective components located beyond the fiber grating, provided the level of extraneous feedback is less than that provided by the fiber grating.

An important aspect for achieving coherence collapse is that the fiber grating provides a sufficiently wide bandwidth, such as several GHz, so that no particular longitudinal mode dominates operation of the laser.

The distance between the laser source output facet and the reflective grating is an important consideration in achieving coherence collapse, as mentioned above. For many embodiments, if the grating is placed within a few centimeters or less of the laser source, then the feedback from the fiber grating may be coherent with the optical field inside the laser source cavity and coherent operation of the laser will result. Coherent emission is very useful for some applications but it is much less stable for the application of pumping solid state or fiber amplifiers and lasers because of the mode-transition noise that results when the laser operating characteristics change, such as may result from changes in ambient temperature or operating current. As a result, if the grating is too close to the laser source output facet, intermittent transitions between coherent and coherence collapse states of operation will cause power output fluctuations detrimental to the operation of such amplifiers and lasers.

To assist the maintenance of coherence collapse of the laser emission, the fiber grating should be located at a sufficient optical distance from the output facet of the laser source, which may be, for example, about 50 cm. to 100 cm. from the laser source output facet. This distance should be greater than the coherence length of the laser source so that optical feedback from the fiber grating remains incoherent, thus, helping ensure the laser consistently remains in a state of coherence collapse. The coherence length is related to the bandwidth of the fiber grating in that wider bandwidth gratings can be placed closer to the laser source but it is also related to other parameters such as the operating wavelength of the laser source and the fiber grating reflectivity and period. Beyond the coherence length, the phase of the optical feedback from the fiber grating is uncorrelated to the phase of the laser source emission at substantially all levels of laser current and temperature operation.

The need to locate the fiber grating beyond the coherence length of the laser causes two problems. The first problem is that this distance may impose unacceptable packaging requirements on some applications because a large amount of fiber pigtail is required. On the one hand, if the pigtail is to be included in the same package that contains the laser source, the package must be large enough to contain the length of pigtail fiber required. This is generally impractical for most packages that comprise industry-standard enclosures such as those mentioned above. On the other hand, if a smaller package is used to contain the laser source, the pigtail fiber must extend outside the package. In certain applications, this may expose the pigtail to potential damage as well as to temperature or pressure fluctuations sufficient to adversely affect operating characteristics of the laser source.

The second problem caused by the need to locate the fiber grating beyond the coherence length of the laser source is that longer distances between the grating and the laser source increases the risk that the reflected light may be unable to successfully perturb the laser source and cause frequent mode transitions due to a change in polarization of the reflected light. This risk is significant in embodiments that form the pigtail and reflective grating using ordinary optical fiber rather than more expensive birefringent optical fiber. Unlike birefringent optical fiber, ordinary optical fiber does not maintain the polarization of light. As a result, light propagating along the pigtail fiber from the laser source to the reflective grating experiences a change in polarization, and light reflected from the grating back to the laser source experiences a further change in polarization. If the polarization of the light reflected back into the laser source cavity experiences a total shift approaching ninety degrees, the feedback effects of this reflected light is reduced to essentially nothing. Changes in polarization of this magnitude allow the laser source to operate in a more-or-less free-running state with an uncontrolled wavelength.

One known technique for avoiding this problem is to use birefringent or polarization-maintaining (PM) optical fiber. The use of PM optical fiber is not attractive because it is very expensive compared to the cost of ordinary optical fiber and because it is more difficult to form gratings in PM optical fiber and to align PM optical fiber with other optical components.

A known technique for reducing the risk of this problem is to increase the reflectivity level of the grating formed in the optical fiber. An increase in the reflectivity of the grating is not attractive because it increases the amount of reflected light, thereby reducing the effective output power of the laser source, and because it lowers the level at which jumps between longitudinal modes will occur. Furthermore, as explained above, the level of the grating reflectivity is usually limited by the output facet reflectivity level.

Another known technique for reducing the risk of this problem is to reduce the length of the pigtail fiber but, as explained above, this technique is constrained by the coherence length of the laser source and may result in coherent operation in the external cavity formed between the laser source output facet and the reflective grating.

In view of various considerations such as the problems related to packaging and polarization, it is desirable to locate the fiber grating in the pigtail fiber as close as possible to the laser source. As indicated above, however, stable operation of the amplifier or laser will not be adequately maintained because the laser source will intermittently switch between coherent and coherence collapse states of operation, causing power glitches or power kinks in the amplifier/laser output as operating conditions such as laser operating current and temperature change.

SUMMARY OF THE INVENTION

It is an object of this invention to provides an improved laser source and a method of operating a laser source that overcome the problems described above.

According to the teachings of one aspect of this invention, an apparatus comprises an enclosure having a plurality of electrical terminals and an opening for an optical waveguide; a laser source arranged inside the enclosure having an electrical input and a light beam output; an optical waveguide passing through the opening in the enclosure and having an input end arranged inside the enclosure and optically coupled to the light beam output; and a dither circuit arranged inside the enclosure having a circuit input coupled to one of the terminals and having a circuit output coupled to the electrical input of the laser source, wherein the dither circuit causes a varying electrical signal to appear at the electrical input of the laser source.

According to the teachings of another aspect of the present invention, a method for operating a laser source to improve operating stability comprises applying an electrical signal to an electrical input of the laser source to generate a light beam output; reflecting a portion of the light beam output back into the laser source using a reflector that is within a coherence length of the laser source; and modifying the electrical signal applied at the electrical input of the laser source to repeatedly perturb the laser source from one operating mode to another operating mode within a plurality of operating modes of the laser source.

According to the teachings of yet another aspect of the present invention, an apparatus for operating a laser source with improved operating stability comprises a means for reflecting a portion of a light beam output of the laser source back into the laser source, wherein this means is within a coherence length of the laser source; and a means for repeatedly perturbing the laser source from one operating mode to another operating mode within a plurality of operating modes.

According to the teachings of a further aspect of the present invention, an apparatus comprises a laser source having two electrical inputs and a light beam output; an optical waveguide having an input end optically coupled to the light beam output; a reflector formed in the optical waveguide to reflect a portion of the light beam back into the laser source; and a dither circuit providing a varying resistance shunt between the two electrical inputs of the laser source.

According to the teachings of another aspect of the present invention, an improved laser source comprises a laser source having an electrical input and a light beam output; an optical waveguide having an input end optically coupled to the light beam output, wherein the optical waveguide is stressed to induce polarization-maintaining behavior; and a reflector formed in the optical waveguide to reflect a portion of the light beam back into the laser source.

According to the teachings of another aspect of the present invention, an apparatus for use in pumping an optical gain medium comprises an enclosure with a terminal that receives an input electrical signal; a dither circuit arranged inside the enclosure and coupled to the terminal to receive a first portion of the input electrical signal that causes the dither circuit to generate a varying signal; and a laser source arranged inside the enclosure and coupled to the terminal and to the dither circuit to receive and be driven by a second portion of the input electrical signal combined with the varying signal.

Other objects and attainments together with a fuller understanding of the invention will become apparent and appreciated by referring to the following description and claims taken in conjunction with the accompanying drawings in which like reference numerals refer to like elements. The contents of the following discussion and the drawings are set forth as examples only and should not be understood to represent limitations upon the scope of this invention.

BRIEF DESCRIPTION OF DRAWINGS

FIG. 1 is a schematic illustration of an embodiment of a stabilized laser source.

FIG. 2 is a schematic illustration of a stabilized laser source similar to that shown in FIG. 1 as applied to a communication fiber amplifier.

FIG. 3 is a schematic illustration of another embodiment of a stabilized laser source.

FIG. 4 is a hypothetical graphical illustration of the output power versus operating current of a pigtailed laser source with a grating close to the laser source output facet without dithering.

FIG. 5 is a hypothetical graphical illustration of the output power versus operating current of a pigtailed laser source with a grating close to the laser source output facet with dithering.

FIG. 6 is a schematic illustration of an embodiment of the invention wherein a dithering source is enclosed within the laser source package.

FIG. 7 is a schematic illustration of another embodiment of the invention wherein a dithering circuit is enclosed within the laser source package and is powered by a common electrical supply to the package.

FIG. 8 is a schematic illustration of yet another embodiment of the invention wherein the dithering circuit is enclosed within the laser source package and is powered by a common electrical supply to the package, and wherein the dither signal from the dithering circuit is electrically isolated from the common electrical supply.

FIGS. 9 through 14 show schematic illustrations of various embodiments of a dithering circuit.

FIG. 15 is a graphical illustration of the output power versus operating current of a pigtailed laser source driven by a signal with different amounts of dither.

FIG. 16 is a graphical illustration of the first derivatives of the power vs. current curves shown in FIG. 15.

FIGS. 17A and 17B are plan and elevation views of an embodiment of a stabilized laser source showing ordinary optical fiber coiled in a manner to induce polarization maintaining characteristics into the fiber.

FIG. 18 is a schematic illustration of a stabilized laser source with a dithering circuit, coiled optical fiber and a reflective grating all enclosed within the laser source package.

DETAILED DESCRIPTION OF THE PREFERRED EMBODIMENTS OF THE INVENTION

As used herein, "waveguide" means any optical waveguide which may be coupled to a laser source, such as a semiconductor laser diode or other light emitting laser source, capable of including an optical periodic or chirped grating. Examples of such optical waveguides are optical fibers, nonlinear crystal waveguides, planar waveguides, and buried waveguides. Also, references to solid state or fiber amplifiers or lasers includes bulk crystal waveguides or devices doped with an active element, e.g., a rare earth material, or a single mode or double clad fiber having a core doped with an active element, both of which are well known in the art. In the case of a laser, an optical resonant cavity is formed by appropriate cavity reflectors as is well known in the art. Further, the "reflector", as utilized in the practice of this invention for feedback stabilization of the laser source in the coherence collapse regime is exemplified as a fiber grating but, as is known to those skilled in the art, can be other types of reflectors such as a dichroic mirror.

Reference is now made to FIG. 1 and apparatus 10 which comprises laser source 11, such as a semiconductor laser diode or a semiconductor master oscillator with either an integrated or with an optically coupled semiconductor amplifier which are, in turn, optically coupled to optical waveguide 31 via coupling optics 20. Laser source 11 has an active region 12, which also represents the laser optical cavity, that is pumped by means of a CW supply current 15, $i_{DC}$. In alternative embodiments, other types of supply current may be used such as, for example, a pulsed current. In pumping applications, laser source 11 is operated in a CW mode. The optical power output from the exit or output facet 13 of laser source 11 is collimated and focused by optics 20 for input to the end of an optical waveguide 31, which is shown here as an optical fiber portion. Optics 20 is a conventional lens system and may comprise a lens 22 to collect and collimate the output beam 14 from output facet 13 and lens 24 to focus the collimated beam to a diffraction limited spot of numerical aperture acceptable by the end of optical waveguide 31. Alternatively, as shown in FIG. 3, optical coupling of laser source 11 to optical waveguide 31 may be accomplished by butt coupling, for example, wherein output beam 14 from laser source 11 is coupled directly into the lensed end of optical waveguide 31.

Apparatus 10 utilizes an optical periodic or chirped grating 34 formed in the optical waveguide 31 in close proximity to output facet 13 such as, for example, within a range from about 1 mm to about 1 m, dependent on various parameters including grating reflectivity, bandwidth and period. In the embodiment illustrated in FIG. 1, grating 34 is shown internal to apparatus 10; however, it should be understood that in many instances the grating is external to apparatus 10 such as is shown in dotted outline at 34A. For ease of discussion and illustration, most of the embodiments discussed below and illustrated in the most of the figures comprise internal reflective gratings.

As previously indicated, any type of feedback reflector may be utilized although a fiber formed grating is the preferred choice since it is easily fabricated within the fiber core with a desired periodicity and given reflectivity level. As an example, grating 34 may be as close as about 2 cm. away from the output facet 13, i.e., well within the coherence length of free-running laser source 11, which length may be tens of centimeters. Grating 34 may be formed in optical waveguide 31 by techniques known in the art including, but not limited to, the use of ultraviolet light and masking techniques.

Laser output facet 13 forms an optical cavity with the laser rear facet and has a reflectivity level suitable for reflecting a small portion of the propagating radiation in the laser source cavity back into active region 12 to maintain oscillating conditions and stimulated emission of laser source 11. External grating 34 also reflects a small portion of the propagating radiation back into the laser optical cavity to control the wavelength of emission of laser source 11 independent of variations in laser operating temperature and operating current via coherence collapse operation of laser source 11. These reflectivity levels are both relatively low, generally not exceeding 10%. In fact, various aspects of the invention allow the reflectivity to be very low in value, such as at 1%, by ensuring there is sufficient feedback strength over feedback variations due to polarization sensitivity of the fiber.

Solid state active or fiber gain medium 30 may be an optical fiber amplifier or fiber laser formed in either a single core or double clad optical fiber. In these respective optical fiber applications, the core or inner cladding is doped with an active gain element. Examples of such an active gain element are rare-earth dopants, such as rare-earth ions $Er^{3+}$, $Nd^{3+}$, $Yb^{3+}$, $Tm^{3+}$ or $Pr^{3+}$ or combinations thereof, such as a co-doped Er:Yb core in a single mode fiber. If gain medium 30 includes a pair of fiber gratings, reflected radiation between these gratings forms an oscillator cavity within the amplifier medium providing for stimulated lasing conditions. Such fiber amplifiers are highly useful in telecommunication applications.

As previously indicated, the problem of placing grating 34 within the coherence length of laser source 11 is that the optical feedback from the grating into active region 12 causes intermittent switching between coherence collapse and coherence states of laser source 11, resulting in fluctuations of laser output power transmitted through the grating, which is undesirable in many applications. Such fluctuations or noise are, for example, manifested by power level spikes or kinks in the output of source 11 due to changes in laser operating current or temperature. As an example, the coherence state may be a narrow band of wavelengths, such as 10 MHz, with a dominate emission wavelength $\lambda_g$ governed by the period of grating 34. In the coherence collapse state, the gain spectrum of laser source 11 is expanded to include a plurality of longitudinal modes having a broad band of wavelengths greater than 1 GHz with a dominate emission wavelength $\lambda_g$ governed by the period of grating 34. Generally, a type of coherence collapse is desired such that no single longitudinal mode produced by laser source 11 within the gain spectrum contains more than about 20% of the total optical power produced by source when in the collapsed state. The switching between states does not occur if grating 34 is positioned in optical waveguide 31 at a sufficient distance from output facet 13 so that laser source 11 will remain in a state of coherence collapse and the phase of the external feedback from grating 34 is uncorrelated to the phase of laser emission at substantially all levels of laser operating current and temperature.

Sometimes such long optical waveguides 31 are not convenient for particular applications, as previously indicated. Therefore, it is desirable in those cases to place grating 34 much closer to output facet 13 of laser source 11; however, unless some corrective measure is taken, intermittent switching between coherence collapse and coherent states of laser source 11 will occur, causing power fluctuations in output beam 14. Also, in fiber amplifier applications, the noise level in the amplifier is increased because reflections from optical components like lenses and optical couplers perturb laser source 11 and cause the output level of laser source 11 to vary because of jumps between longitudinal modes, for example. To effectively avoid the effects of this intermittent switching in the operation of laser source 11, a small variation in the operating current is provided which also varies the phase of the laser emission to effectively drive laser source 11 into coherence collapse in a controlled manner. In other words, the switching of laser source 11 between coherent and coherence collapse states is controlled in such a manner that laser source 11 is much more likely to operate in a coherence collapse state. If the time interval between these state transitions is about equal to or shorter than the relaxation time, lifetime or recombination time of the excited or fluorescence state of active gain element 35 in gain medium 30, then the performance of gain medium 30 will not be affected by any intermittent switching between coherent and coherence collapse states of laser source 11, thereby improving the gain stability of gain medium 30. As an example, if gain medium 30 has incorporated an active gain element comprising Er ions, the fluorescence lifetime of Er is about 10 ms., which corresponds to a periodic variation of about 100 Hz. If a small periodic variation in the operating current is applied, such as a modulated rate of ten times greater than that required to maintain the gain saturation of the amplifier, e.g., about 1 kHz to about 10 kHz or more, the power fluctuations in the output of laser source 11 on gain medium 30 will be effectively eliminated or otherwise substantially attenuated. Thus, if the average time interval between variation is less than the fluorescence lifetime of the rare-earth dopant of gain medium 30, typically from several hundred $\mu$sec. to 1 msec., then the switching between coherent and coherence collapse states will be controlled so that the effects of power level spikes or power output kinks due to longitudinal transitions, are effectively avoided. As a result, the output from this arrangement is approximately equal to an average of the output achieved by operating laser source 11 in a coherence collapse state.

As shown in the embodiment illustrated in FIG. 1, laser supply current 15, $i_{DC}$, is provided for operating laser source 11. Supply current $i_{DC}$ may be CW or pulsed, but is generally CW for applications for pumping gain medium 30. Also, a supplemental varying input current 17 provides a smaller modulated signal or dither signal $\Delta i(t)$ to affirmatively drive laser source 11 into coherence collapse. Supply current 15 is summed with varying input current 17 at 16 to provide input signal 25 for driving laser source 11. An electronic semiconductor chip or other dither circuit for providing modulated signal $\Delta i(t)$ may be included as part of the package enclosing apparatus 10, which is represented by the dotted rectangle in FIG. 2. This aspect is discussed in more detail below.

In FIG. 3, a representation of input signal 25 is shown as continuous current 26, $i_{DC}$, with a superimposed periodic modulated signal or dither signal 27 having a period that is less than the relaxation time or the fluorescence lifetime of the active gain element 35 of gain medium 30, e.g., less than 1 msec.

The variation or dither may be periodic or stochastic, i.e., random noise. If a noise-like signal is employed, then a high pass filter may be required to remove low frequency components present in the input signal which could affect gain media operation. An example of such a filter is shown in FIG. 1 as an RC filter comprising capacitor 18 and resistor 19. Alternatively, an LC filter can be used.

The embodiment illustrated in FIG. 2 shows apparatus 10 in a telecommunication application. Apparatus 10 is generally the same as that shown in FIG. 1. If grating 34 were to be placed beyond the coherence length of laser source 11, laser source 11 would provide a continuous dominate output wavelength of 980 nm via continuous or pulsed supply current 15, $i_{DC}$. Since grating 34 is within the coherence length of laser source 11, e.g., 2 to 3 cm. from output facet 13, apparatus 10 is provided with a small varying input current 17, $\Delta i(t)$, modulated at a rate about equal to or in excess of the reciprocal of the relaxation time of the active gain element in a pumped gain medium 44. As explained above, the varying input current attenuates effects of uncontrolled intermittent switching between the coherent and coherence collapse states of source 11. A communication transmission fiber 40 carries a communication signal at a wavelength of 1550 nm, for example. Gain medium 44 comprises a fiber amplifier 46 that has a section doped with Er ions 48. Conventional coupling optics 42 couple the signal from transmission fiber 40 into the core of gain medium 44 and the pump signal from fiber 32 into the doped inner cladding of gain medium 44. By practicing the teachings of the invention, apparatus 10 can operate as an almost-ideal pump source for gain medium 44, providing an output wavelength of 980 nm or 1480 nm within the absorption band of the Er doped gain medium 44, resulting in gain for the 1550 nm signal propagating in its core.

It should be recognized that more than one laser source 11 may be utilized. As an example, at least two independent laser sources of different wavelength may be optically coupled, such as by a WDM coupler, to gain medium 30, wherein the respective laser sources are driven by either a single time-varying signal to both laser sources or multiple-time varying signals, one to each laser source, to improve the gain stability of gain medium 30 over its gain spectrum. The single modulated signal or the respective modulated signal for each laser source may be (1) synchronous or asynchronous, (2) either in phase, out of phase or of alternating phase, and/or (3) of the same or of different amplitude and/or frequency.

FIGS. 4 and 5 are hypothetical graphical illustrations of the utility of using a dithering circuit in combination with a reflective grating. The power-versus-current curve 140 in FIG. 4 has a plurality of kinks 142 due to the placement of a fiber grating within the coherence length of a semiconductor laser source; that is, within a few centimeters or less of the output facet of the laser source. Kinks 142 are caused by the laser source switching uncontrollably between states of coherency and coherence collapse which, in the context of this disclosure, includes switches between states of varying degrees of coherency and/or coherence collapse. The top of kinks 142 correspond to the laser source operating in a state of coherence collapse. The bottom of kinks 142 correspond to the laser source operating in a coherent state. Curve 144 represents the first derivative of the power-versus-current curve 140, which illustrates the extent of the noise caused by kinks 142 in curve 140. Laser sources with output characteristics like that illustrated in FIG. 4 are not acceptable for use with a fiber amplifier or laser because its utility depends on a smooth monotonic increase in optical power as a function of the applied operating current. The effects of kinks 142 are accentuated, for example, when the output of the laser source is employed for pumping a solid state amplifier.

If the state of coherence collapse is controlled according to the teachings of the invention, the effects of kinks 142 can be smoothed over time as shown in FIG. 5. The improved operational characteristics illustrated in FIG. 5 are achieved by varying the operating current at a rate higher than the reciprocal of the relaxation time of the active gain element of the amplifier so that any kinks are averaged over time. The portion 148 of power-versus-current curve 146 is significantly smoother than the kinks 142 in curve 140. This can be easily seen by comparing the derivative of slope curve 150 with the original derivative of slope curve 144.

Preferably, the source of the modulated signal or dither signal is enclosed within module 50 that includes the laser source, as illustrated in FIG. 6. As shown, laser pump module 50 comprises an enclosure 51 containing laser source 52. Module 50 includes pigtail fiber 53, which has fiber grating 55 formed in close proximity to the input end 57 of fiber 53 for providing feedback into laser source 52 to cause source 52 to operate in the coherence collapse regime. Fiber grating 55 may be arranged internal to enclosure 51, as shown in FIG. 6, but is frequently arranged external to enclosure 51. Module 50 also contains dithering source 58, which may be a dither circuit similar to those described below. The "pin-out" or electrical terminals of the module include a terminal for DC input 54 that provides sufficient bias or current to operate laser source 52. Also, the pin-out of the module may include a terminal for supplying power to dither source 58. In the embodiment shown, the dither signal from source 58 is added to the DC signal by summing circuit 56 to cause a varying or dithered operating current to flow through laser source 52 in a manner that, in conjunction with a closely spaced fiber grating 55, stabilizes the pumping function for the fiber amplifier.

A principal advantage of the embodiment shown in FIG. 6 is that the end user of module 50 need not be concerned about the presence of dithering or the location of dithering source 58 within module 50. Unfortunately, known art does not teach or suggest how to incorporate dither sources into presently designed industry-standard enclosures for laser sources. Some of these enclosures have been adopted as a standard, such as the 14-pin butterfly package, and it is not feasible to redesign the enclosures or to alter the use or specification of package pin-outs to accommodate conventional dither sources.

FIG. 7 is a schematic illustration of an embodiment of laser source module 60 comprising a dither circuit 68 that can be implemented inside many industry-standard enclosures 61 and can be powered by the same DC input 64 used to operate laser source 62. Module 60 includes pigtail fiber 63 which has fiber grating 65 formed in close proximity to the input end 67 of fiber 63, external to enclosure 61, for providing optical feedback into laser source 62. Fiber 63 may be coupled by fusion splicing at 63A to a fiber gain medium 69 that includes an active gain element in the fiber core. The coupling may be made to fiber gain medium 69 as shown in the figure or it may be made in some other manner such as, for example, by means of a wavelength-division multiplexor (WDM) coupler. Stability in laser source operation is achieved even though fiber grating 65 is within the coherence length of free-running laser source 62 by using dither circuit 68 to generate a dithered signal that can be added to DC input 64 by summing circuit 66, as discussed above. Alternatively, by implementing summing circuit 66 as a simple connection in the embodiment shown in FIG. 7, dither circuit 68 can cause a varying or dithered signal to appear at the electrical input of laser source 62 by providing a variable-resistance shunt between the electrical input and ground. Because dither circuit 68 can be powered by DC input 64 provided to module 60 for operating laser source 62, the use or specification of package pin-outs do not need to changed.

Preferably, dither circuit 68 provides high-frequency dither in the range from about 1 MHz to several hundred MHz. In some applications, it is desirable to operate the dither circuit and the laser source from a common power supply. Because the threshold voltage for many laser sources is less than two volts, in some preferred embodiments the dither circuit provides these high frequencies while operating at low voltages. Preferably, the presence of dither circuit 68 is obscured by incorporating a low-pass filter or other method of screening the high-frequency dither from detection outside enclosure 61. A simple example of such a filter is inductor 72 as shown in FIG. 8.

Preliminary studies suggest that the effectiveness of the dither may be increased by matching the dither frequency to a harmonic or subharmonic of the resonant frequency of the external cavity formed between the laser source and the reflective grating. One way in which this may be accomplished is to provide a component that can be adjusted to tune the dither frequency after the laser source and the pigtail fiber grating have been assembled.

FIGS. 9 through 14 illustrate dither circuits that provide a variable-resistance shunt across a laser source such as a laser diode. These circuits are shown as examples to illustrate concepts and general implementation features but are not intended to illustrate all of the components that might be required in practical implementations. The use of a shunt is generally preferred because it readily permits the dither circuit to be powered by the same supply voltage provided to operate the laser source. Dither circuits that provide additive dither are usually not preferred because such circuits require a supply voltage that is higher than the voltage of the signal used to operate the laser source. If desired, however, a higher voltage can be obtained from the package power supply by any of a variety of techniques including so called "voltage-doubler" circuits. A higher voltage may be necessary if, for example, the desired dither frequency is higher than can be reliably generated by practical or cost-effective circuitry operating at the typically low supply voltage.

FIG. 9 illustrates a block diagram of a dither circuit that provides a periodic dithered signal. Terminal 84 receives supply current $i_{DC}$ that provides power to dither circuit 88 and to laser source 82, which in this embodiment is a laser diode. Dither circuit 88 comprises oscillator 85 that causes switch 87 to open and close at the desired rate of the dither signal. The operating current flowing through laser source 62 may be expressed as:

$$i_D = i_{DC-iO} - i_S \quad (1)$$

where $i_D$=operating current for laser source 82;
$i_{DC}$=total supply current;
$i_O$=current required to operate dither circuit 88; and
$i_S$=shunt current flowing into switch 87.

When switch 87 is open, the shunt current is zero. When switch 87 is closed, the shunt current is limited by the impedance of switch 87 and shunt resistor $R_S$.

In practical applications, supply current $i_{DC}$ is provided by a substantially constant-current source. If oscillator current $i_O$ is also substantially constant, then operating current $i_D$ for the laser source varies inversely to variations in shunt current $i_S$. In applications where the source of supply current $i_{DC}$ is not a constant-current source but instead is, for example, a constant-voltage source, then the operating current $i_D$ can be made to vary inversely to variations in shunt current $i_S$ by inserting a series resistance in the circuit between terminal 84 and node 86.

FIG. 10 illustrates one embodiment of dither circuit 88 and laser source 82 Resistors R1 to R4, capacitor C1 and operational amplifier U1a implement oscillator 85. Transistor Q1 implements switch 87 and resistor Rs is the shunt resistor. Buffer U1b and resistor R5 provide suitable bias current to Q1 in response to the dithered or oscillating signal received from the output of U1a. D1 is a semiconductor-diode laser such as that found in SDL-2300 series or SDL-5400 series packages available from SDL, Inc. of San Jose California. Values for the components that are shown in the figure provide a dithered signal of about 516 kHz. This rate is suitable for some applications but may be too low for other applications.

FIG. 11 illustrates another embodiment of dither circuit 88 using discrete components. This embodiment is faster than the embodiment shown in FIG. 10 and provides a dithered signal of about 1.5 MHz.

FIG. 12 illustrates another embodiment of dither circuit 88 in which NOT-gate U1, capacitors C1 and C2, and quartz crystal X1 implement oscillator 85. The use of a crystal in this embodiment provides an oscillator with greater stability than the oscillator in the circuit of FIG. 9.

Thermistors may be used to improve thermal stability. For example, one or more thermistors can be used to adjust the frequency and/or amplitude of the oscillator as a function of operating temperature. In general, thermal stability for dither frequency is not critical; however, thermal stability for dither amplitude may be more important.

FIGS. 15 and 16 illustrate the effects of dither amplitude. The three curves 161, 162 and 163 shown in FIG. 15 represent the relationship between output power and operating current for a laser source driven with no dither, moderate dither, and high dither, respectively. The moderate level of dither has a peak-to-peak amplitude of 12 mA. The high level of dither has a peak-to-peak amplitude of 24 mA.

FIG. 16 illustrates the first derivatives of the three curves shown in FIG. 15. The three curves in the figure are offset vertically from one another for illustrative clarity. The large excursions in the first derivative of curve 161, denoted as 165, clearly show there are many kinks in the output characteristics of the laser source without dither. The first derivatives of curves 162 and 163, denoted as 166 and 167, respectively, are much smoother and clearly show that the kinks are reduced with increased dither amplitude. This is particularly apparent in the range of operating current from about 50 mA to about 150 mA.

FIG. 13 is a block diagram of dither circuit 98 that provides a noise-like dithered signal. Terminal 94 receives supply current $i_{DC}$ that provides power to dither circuit 98 and to laser source 92, which in this embodiment is a laser diode. Dither circuit 98 comprises noise source 95 that causes switch 97 to open and close in an aperiodic manner. Filter 96 may be used as needed to attenuate any frequencies that are either too low or too high. In many embodiments, filter 96 is needed to attenuate frequencies that are too low. The operation of switch 97 and shunt resistor $R_S$ is similar to that discussed above.

FIG. 14 illustrates one embodiment of dither circuit 98. Diode $D_N$ is a stochastic noise source that generates a noise signal buffered by U1. Resistors R1 and R2 provide proper bias for diode $D_N$ and transistor Q1, respectively. This embodiment does not include components to implement filter 96.

Suitable dither circuits may implemented in wide variety of ways such as by discrete components as shown in FIG. 11 or with integrated-circuit components as shown in FIG. 10. By using surface mount technology, for example, dither circuits can be implemented on circuit boards that are small enough to fit inside many industry-standard enclosures. A dither circuit may also be implemented in the same piece of material used to form the laser source. For example, monolithic laser-dither devices can be implemented using Gallium Arsenide or Indium Phosphide materials. These materials are attractive because the resulting circuits are fast enough to provide dithered signals that are sufficiently high in frequency.

FIGS. 17A and 17B illustrate additional embodiments of a laser source incorporating aspects of this invention that are directed toward solving a problem that causes some 980 nm laser diode pump modules to fail during operation. It has been determined that certain failures are caused by the polarization characteristics of the pigtail fiber. As is well known, laser diodes operate in one polarization mode such as TE mode in which polarization is transverse to the junction plane of the laser source. Under certain conditions, the light reflected back into the laser source cavity from a fiber grating formed in the pigtail fiber experiences a substantial rotation in polarization, which substantially reduces the stabilizing effectiveness of the reflected light. As the amount of rotation approaches ninety degrees, the stabilizing effectiveness of the reflected light is reduced to zero; hence, substantial amounts of rotation in polarization allows the laser diode to operate without benefit of the stabilizing effects of the grating.

If the polarization characteristics of the pigtail fiber is substantially uniform, the amount of rotation is proportional to the distance between the laser diode output facet and the fiber grating. The amount of rotation can be controlled by reducing the length of the pigtail fiber and/or by increasing the polarization-maintaining (PM) characteristics of the pigtail fiber. It is well known that, without the benefits of this invention, the length of the pigtail fiber between the laser source output facet and the reflective grating must be greater than the coherence length of the laser source to provide reasonable assurance the laser source will operate in the coherence collapse regime. This length, however, permits substantial rotation of the polarization of the emitted and the reflected light unless polarization-maintaining (PM) optical fiber is used. Unfortunately, the use of PM fiber is not attractive because its present cost is very high in terms of material and labor required to align the fiber.

Another way to reduce rotational effects is to increase the reflectivity level of the reflective grating. Unfortunately, the effectiveness of this approach rapidly diminishes as the amount of rotation approaches ninety degrees and the increased reflectivity reduces the output power of the laser module because less light is allowed to propagate through the reflective grating. Because of polarization effects, the reflectivity level of the grating is often set to about 2% to 5%. If these polarization effects could be avoided, this level could be set to less than 1%.

With the benefits of this invention, however, polarization rotation can be reduced by placing the reflective grating closer to the laser source and controlling the operation of the laser source with dithering. This not only improves the stability of the laser source but it also reduces its sensitivity to polarization effects, thereby permitting the use of less expensive non-PM optical fiber and allowing the reflectivity level of the reflective grating to be reduced.

Referring again to FIGS. 17A and 17B, the embodiment illustrated in these figures incorporates a feature than can be used to provide even greater stability by directly controlling polarization rotation effects. This feature controls these rotational effects by inducing PM behavior into optical fiber that otherwise does not have this characteristic.

FIGS. 17A and 17B are plan and elevation views of the embodiment, respectively. Container 180 comprises laser module 182 optically coupled to optical fiber 184 that includes reflective grating 188 for stabilizing the optical output 189 of the laser source. The schematic representation of laser module 182 suggests it is contained within an industry-standard 14-pin butterfly package; this particular package is merely an example. A portion of optical fiber 184, which may be ordinary optical fiber without birefringent properties, is wound into a coil as illustrated at 186. The plane of coil 186 is substantially parallel to the laser diode TE mode direction, which is the lateral or horizontal direction indicated by arrow 183. Coil 186 induces sufficient birefringence into fiber 184 so that light emitted from laser module 182 along one of the principal axes of polarization remains substantially polarized with that axis. Fiber grating 188 is formed in fiber 184 on the side of coil 186 that is opposite laser module 182. No particular coil size is critical to the principle of this invention; however, calculations according to S. C. Rashleigh, et al., "High Birefringence in Tension coiled Single Mode Fibers", *Optical Letters,* vol. 5, page 354 et seq. (1980), incorporated herein by its reference, show that a 2.54 cm. diameter coil of fiber wound with a tensile strain of 1% induces a birefringent beat length of about 5 cm, which is sufficient for many implementations. It should be noted that this technique is not practical for laser sources at longer wavelengths, such as 1.5 $\mu$m, because the coiled fiber is very lossy at longer wavelengths unless greater refractive indices are provided between the light propagating core of the fiber and the surrounding cladding.

This aspect of the invention has the advantage of not requiring expensive PM fiber and it does not incur the additional difficulty of aligning PM fiber with the laser source and with a fiber amplifier or other application. In addition, the final orientation of coil 186 can be easily controlled and adjusted, allowing for a simple "programming" of fiber birefringence to achieve the desired orientation of polarization for the light propagating in the fiber between the laser source and the fiber grating.

In an alternative embodiment not shown in the figures, PM behavior can be induced into optical fiber that otherwise does not have this characteristic by clamping a length of the fiber between two surfaces that are substantially parallel with the TE mode and applying pressure to the surfaces to squeeze the fiber. When stressed in this manner, the optical fiber will tend to preserve the polarization of TE mode emissions even though it is otherwise substantially insensitive to polarization. These surfaces may be integrated with the structure used to hold and align the fiber with the laser source.

Reference is now made to FIG. 18 illustrating an embodiment of a stabilized laser source incorporating a dither circuit and reflective grating as illustrated in FIG. 9, for example, with the coiled optical fiber as illustrated in FIGS. 17A and 17B. In the embodiment shown in FIG. 18, enclosure 190 comprises laser source 195 supplied with operating current via supply lines 191A and 191B. A dither circuit comprising oscillator 192 and switch 194 provides a dither signal to laser source 195. The light output of laser source 195 is coupled to polarization-sensitive optical fiber 194 with coil 196 interposed between the input end of fiber 194 and fiber grating 198. Because of the dithered signal, fiber grating 198 may be formed in a length of pigtail fiber 196 that is shorter than the coherence length of laser source 195. By winding coil 196 tightly enough, laser source 195, the dither circuit and pigtail fiber 194 with coil 196 and reflective grating 198 can be placed within many industrial-standard enclosures. Such an embodiment places all of these components within the protected confines of the enclosure.

With respect to the foregoing embodiments of FIGS. 17A, 17B and 18, there is some concern about the long term reliability of optical fiber placed under tension in a tightly wound coil; however, this concern is diminishing as improvements in the manufacture and flexibility of optical fibers are being realized.

What is claimed is:

1. An apparatus comprising:
    an enclosure having a plurality of electrical terminals and an opening for an optical waveguide;
    a laser source arranged inside the enclosure having an electrical input and a light beam output;
    an optical waveguide passing through the opening in the enclosure and having an input end arranged inside the enclosure and optically coupled to the light beam output; and
    a dither circuit arranged inside the enclosure having a circuit input coupled to one of the terminals and having a circuit output coupled to the electrical input of the laser source, wherein the dither circuit causes a varying electrical signal to appear at the electrical input of the laser source.

2. An apparatus according to claim 1 further comprising a reflector formed in the optical waveguide to reflect a portion of the light beam back into the laser.

3. An apparatus according to claim 2 wherein the optical waveguide is an optical fiber and the reflector is a fiber grating formed in the optical fiber.

4. An apparatus according to claim 2 wherein the reflector and the laser source form an external cavity in the optical waveguide that has a resonant frequency and the dither circuit causes the varying electrical signal to have a frequency that is a harmonic or subharmonic of the resonant frequency of the external cavity.

5. An apparatus according to claim 1 wherein the enclosure is an industry-standard enclosure that is sealed.

6. An apparatus according to claim 2 wherein the reflector is arranged inside the enclosure.

7. An apparatus according to claim 6 wherein the enclosure is an industry-standard enclosure that is sealed.

8. An apparatus according to claim 1 wherein the electrical input of the laser source and the circuit are both coupled to one of the terminals so as to receive electrical power from a common power supply.

9. An apparatus according to claim 8 wherein the common power supply presents a voltage at the one terminal to which the electrical input of the laser source and the dither circuit are coupled that is less than two volts.

10. An apparatus according to claim 9 that comprises a second circuit having an input coupled to the one terminal and having a higher-voltage output that provides power at a voltage higher than the voltage presented at the one terminal, wherein the dither circuit receives power from the higher-voltage output.

11. An apparatus according to claim 1 wherein the optical waveguide is a polarization-maintaining optical waveguide.

12. An apparatus according to claim 11 wherein the optical waveguide is stressed to achieve polarization-maintaining characteristics.

13. An apparatus according to claim 11 wherein the laser source emits light predominantly in a TE mode and the optical waveguide is optical fiber that is stressed by winding the optical fiber into one or more coils in a plane substantially parallel with the TE mode emissions.

14. An apparatus according to claim 1 further comprising a filter that blocks or significantly attenuates an appearance of the varying electrical signal on any of the electrical terminals.

15. An apparatus according to claim 1 wherein the dither circuit causes the varying electrical signal to appear at the electrical input of the laser source by providing a varying resistance between electrical terminals of the laser source.

16. An apparatus according to claim 1 wherein the dither circuit causes the varying electrical signal to have noise-like properties.

17. An apparatus according to claim 1 wherein the laser source and at least part of the dither circuit are formed in a common piece of material.

18. An apparatus according to claim 1 wherein the dither circuit comprises one or more components that adjust frequency and/or amplitude of the varying electrical signal in response to changes in temperature.

19. An apparatus according to claim 1 wherein the dither circuit comprises a variable component, the variation of which changes frequency or magnitude of the varying electrical signal.

20. A method for operating a laser source to improve operating stability comprising steps to perform the acts of:
    applying an electrical signal to an electrical input of the laser source to generate a light beam output;
    reflecting a portion of the light beam output back into the laser source using a reflector that is within a coherence length of the laser source; and
    modifying the electrical signal applied at the electrical input of the laser source to repeatedly perturb the laser source from one operating mode to another operating mode within a plurality of operating modes of the laser source.

21. An apparatus according to claim 20 wherein the reflector and the laser source form an external cavity that has a resonant frequency and the electrical signal is modified to have a frequency that is a harmonic or subharmonic of the resonant frequency of the external cavity.

22. A method according to claim 20 that comprises modifying the electrical signal applied at the electrical input of the laser source with a dither circuit that is powered by source of power that also powers the laser source.

23. A method according to claim 20 wherein the source of power presents a voltage that is less than two volts.

24. A method according to claim 20 wherein the optical waveguide has polarization-maintaining characteristics.

25. A method according to claim 24 that comprises stressing the optical waveguide to induce the polarization-maintaining characteristics into the optical waveguide.

26. A method according to claim 25 that comprises compressing the optical waveguide between surfaces, wherein the laser source emits light predominantly in a TE mode and the surfaces are substantially parallel with the TE mode emissions.

27. A method according to claim 20 wherein the electrical signal applied to the electrical input of the laser source is modified by varying a resistance between electrical terminals of the laser source.

28. A method according to claim 20 wherein the electrical signal applied to the electrical input of the laser source is modified to have noise-like properties.

29. A method according to claim 20 that comprises adjusting frequency and/or amplitude of modified electrical signal in response to changes in temperature.

30. An apparatus for operating a laser source with improved operating stability comprising:
reflecting means for reflecting a portion of a light beam output of the laser source back into the laser source, wherein the means for reflecting is within a coherence length of the laser source; and
dither means for repeatedly perturbing the laser source from one operating mode to another operating mode within a plurality of operating modes.

31. An apparatus according to claim 30 wherein the reflecting means is provided by a fiber grating formed in an optical fiber that is optically coupled to the laser source.

32. An apparatus according to claim 30 wherein the reflecting means and the laser source form an external cavity that has a resonant frequency and the dither means perturbs the laser source at a frequency that is a harmonic or subharmonic of the resonant frequency of the external cavity.

33. An apparatus according to claim 30 that is arranged within an industry-standard enclosure that is sealed.

34. An apparatus according to claim 30 wherein the laser source and the dither means are both coupled to a common source of power.

35. An apparatus according to claim 34 wherein the common source of power presents a first voltage that is less than two volts.

36. An apparatus according to claim 34 that comprises a means coupled to the common source of power that provides power at a voltage higher than the first voltage, wherein the dither means receives power at the higher-voltage.

37. An apparatus according to claim 30 that comprises an optical waveguide optically coupled to the light beam output of the laser source that has polarization-maintaining characteristics.

38. An apparatus according to claim 37 that comprises means for stressing the optical waveguide to induce the polarization-maintaining characteristics into the optical waveguide.

39. An apparatus according to claim 30 wherein the dither means provides varying resistance between electrical terminals of the laser source.

40. An apparatus according to claim 30 wherein the laser source and at least part of the dither means are formed in a common piece of material.

41. An apparatus according to claim 30 that comprises means for adjusting frequency and/or amplitude of output of the dither means.

42. An apparatus according to claim 30 wherein the dither means comprises a variable component, the variation of which changes a frequency for repeatedly perturbing the laser source.

43. An apparatus comprising:
a laser source having two electrical inputs and a light beam output;
an optical waveguide having an input end optically coupled to the light beam output;
a reflector formed in the optical waveguide to reflect a portion of the light beam back into the laser source; and
a dither circuit providing a varying resistance shunt between the two electrical inputs of the laser source.

44. An apparatus according to claim 43 wherein the optical waveguide is an optical fiber and the reflector is a fiber grating.

45. An apparatus according to claim 43 wherein the reflector and the laser source form an external cavity in the optical waveguide that has a resonant frequency and the dither circuit causes the varying resistance shunt to vary at a frequency that is a harmonic or subharmonic of the resonant frequency of the external cavity.

46. An apparatus according to claim 43 wherein the dither circuit varies the resistance shunt in a manner having noise-like properties.

47. An apparatus according to claim 43 wherein the laser source and at least part of the dither circuit are formed in a common piece of material.

48. An apparatus according to claim 43 wherein the dither circuit comprises one or more components that adjust frequency and/or amplitude of variations of the resistance shunt in response to changes in temperature.

49. An apparatus according to claim 43 wherein the dither circuit comprises a variable component, the variation of which changes frequency or resistance range of the varying resistance shunt.

50. An improved laser source comprising:
a laser source having an electrical input and a light beam output;
an optical waveguide having an input end optically coupled to the light beam output, wherein the optical waveguide is stressed to induce polarization-maintaining behavior; and
a reflector formed in the optical waveguide to reflect a portion of the light beam back into the laser source.

51. An apparatus according to claim 50 wherein the laser source emits light predominantly in a TE mode and the optical waveguide is optical fiber that is stressed by winding the optical fiber into one or more coils in a plane substantially parallel with the TE mode emissions.

52. An apparatus according to claim 50 that comprises surfaces compressing the optical waveguide, wherein the laser source emits light predominantly in a TE mode and the surfaces are substantially parallel with the TE mode emissions.

53. An apparatus for use in pumping an optical gain medium comprising:
an enclosure with a terminal that receives an input electrical signal;
a dither circuit arranged inside the enclosure and coupled to the terminal to receive a first portion of the input electrical signal that causes the dither circuit to generate a varying signal; and
a laser source arranged inside the enclosure and coupled to the terminal and to the dither circuit to receive and be driven by a second portion of the input electrical signal combined with the varying signal.

54. An apparatus according to claim 53 wherein the input electrical signal is a direct current, the varying signal is an alternating current, and the second portion of the input electrical signal and the varying signal are combined to add the alternating current to the direct current.

55. An apparatus according to claim 53 wherein the input electrical signal is a direct current, the varying signal is an alternating current, and the second portion of the input electrical signal and the varying signal are combined to subtract the alternating current from the direct current.

56. An apparatus according to claim 53 wherein the dither circuit is implemented on a semiconductor substrate.

57. An apparatus according to claim 53 wherein the dither circuit is implemented by a plurality of discrete electrical components.

58. An apparatus according to claim 53 that further comprises an optical waveguide coupled to an optical output of the laser source and a reflector formed in the optical waveguide, wherein the reflector is arranged to reflect a portion of the optical output back into the laser source to stabilize the operating characteristics of the laser source.

59. An apparatus according to claim 58 wherein the reflector is arranged to cause the laser source to operate in a coherence collapse state.

* * * * *